US010250018B2

(12) United States Patent
Baillargeon et al.

(10) Patent No.: US 10,250,018 B2
(45) Date of Patent: Apr. 2, 2019

(54) ELECTRICAL DISTRIBUTION APPARATUS AND METHODS OF ASSEMBLING SAME

(71) Applicant: ABB Schweiz AG, Baden (CH)

(72) Inventors: Jeremy Robert Baillargeon, Southington, CT (US); John Matthew Hutson, Plainville, CT (US); Gregory Mathais Probert, Plantsville, CT (US); Dennis Rehmer, Bristol, CT (US); Javier Larranaga, Bristol, CT (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/252,904

(22) Filed: Aug. 31, 2016

(65) Prior Publication Data

US 2018/0062359 A1 Mar. 1, 2018

(51) Int. Cl.

| | |
|---|---|
| ***H02B 1/21*** | (2006.01) |
| ***H01R 25/16*** | (2006.01) |
| ***H05K 7/14*** | (2006.01) |
| ***H02B 1/052*** | (2006.01) |
| ***H02B 1/24*** | (2006.01) |
| ***H02B 1/056*** | (2006.01) |

(52) U.S. Cl.

CPC ............. *H02B 1/21* (2013.01); *H01R 25/162* (2013.01); *H02B 1/052* (2013.01); *H02B 1/056* (2013.01); *H02B 1/24* (2013.01); *H05K 7/1457* (2013.01)

(58) Field of Classification Search

CPC .. H05K 7/1457; H05K 1/0263; H05K 7/1432; H05K 2201/044; H05K 7/1492; H05K 2201/09236; H05K 3/4641; H05K 7/1459; H05K 2201/093; H05K 2201/09663; H01R 12/7088; H02B 1/21; H02B 1/205

See application file for complete search history.

(56) References Cited

U.S. PATENT DOCUMENTS

| | | | | |
|---|---|---|---|---|
| 2,914,708 A * | 11/1959 | Edmunds | H02B 1/056 174/99 B |
| 3,354,357 A | 11/1967 | Jorgensen et al. | |
| 3,721,864 A | 3/1973 | Rozenboom | |
| 4,031,433 A | 6/1977 | Olashaw | |
| 4,153,318 A | 5/1979 | Bishop et al. | |

(Continued)

FOREIGN PATENT DOCUMENTS

CA 1087721 10/1980

OTHER PUBLICATIONS

EP Search Report and Opinion issued in connection with corresponding EP Application No. 17187382.1 dated Dec. 15, 2017.

(Continued)

*Primary Examiner* — Adam B Dravininkas
(74) *Attorney, Agent, or Firm* — Barnes & Thornburg LLP

(57) ABSTRACT

An electrical distribution apparatus includes a backplane for supporting a plurality of electrical devices, a bus bar assembly coupled to the backplane, and a frame that supports the backplane. The electrical distribution apparatus also includes at least one positioning member that facilitates positioning the backplane relative to the frame. The at least one positioning member at least partially supports the backplane such that the backplane is positionable between a first position and a second position. The backplane contacts the frame in the second position.

12 Claims, 7 Drawing Sheets

130 110 131 130 130 152 132 133 148 146 148 146 150 150 138 108 134 140 106 142 144 122 136

(56) References Cited

U.S. PATENT DOCUMENTS 4,588,854 A 5/1986 Bailey et al.
4,713,728 A * 12/1987 Raabe .................... H02B 1/42 361/634
4,744,003 A 5/1988 Koslosky et al.
5,024,627 A * 6/1991 Bennett .............. H01R 12/7005 439/247
5,046,173 A 9/1991 Wall, Jr.
5,092,787 A * 3/1992 Wise ...................... H02G 3/288 439/211
5,343,356 A * 8/1994 Hancock ................ H02B 1/056 174/68.2
5,530,205 A 6/1996 Parks et al.
5,875,093 A * 2/1999 White .................... H02B 1/052 361/637
5,954,823 A * 9/1999 Cutts ...................... G06F 1/189 713/300
5,969,938 A * 10/1999 Byrne .................. H05K 7/1457 361/614
6,061,230 A 5/2000 Mazzella et al.
6,486,406 B1 11/2002 Greco et al.
8,238,108 B2 8/2012 Hornkamp
8,320,107 B2 11/2012 Coffey et al.
8,379,374 B2 * 2/2013 Keegan ................ H01R 25/142 174/68.2
9,716,372 B2 7/2017 Strong et al.
9,812,848 B2 * 11/2017 Bellows ................ H01B 17/18
2004/0201972 A1 * 10/2004 Walesa ................ H01R 25/164 361/788
2008/0158786 A1 * 7/2008 Letourneau ............ H02B 1/056 361/637
2013/0114202 A1 5/2013 Lin et al.
2015/0036272 A1 * 2/2015 Tachibana ............... G06F 1/189 361/679.4
2016/0233649 A1 8/2016 Baillargeon et al.
2017/0125982 A1 * 5/2017 Bellows ................... H02B 1/20

OTHER PUBLICATIONS

H Grasset et al., “Busbar Protection Design for Economy of Panel Space, Minimised Power Consumption, and Advanced Performance”, Developments in Power System Protection, 2008. DPSP 2008. IET 9th International Conference on, pp. 546-550, Mar. 17-20, 2008, Glasgow.

* cited by examiner

ELECTRICAL DISTRIBUTION APPARATUS AND METHODS OF ASSEMBLING SAME

BACKGROUND

The field of the disclosure relates generally to electrical distribution apparatuses, and more particularly, to an electrical distribution apparatus including a bus bar assembly that is coupled to a backplane supported by a frame.

At least some known panelboards include a wall-mounted enclosure and an electrical distribution apparatus that controls electrical distribution from a main to one or more branch circuits. At least some known electrical distribution apparatuses include conductive bus bars and electrical devices, such as circuit breakers, electrically coupled to the bus bars. In addition, at least some known electrical distribution apparatuses include support structure to support the bus bars and the electrical devices within the wall-mounted enclosure. However, at least some electrical distribution apparatuses are custom designed to fit within a specific wall-mounted enclosure. Moreover, the electrical distribution apparatuses are large and unwieldy. Accordingly, the bus bars and support structure require extra labor and special equipment to assemble and transport to an installation site. In addition, extra labor and special equipment is required to install the bus bars and support structure at the installation site.

BRIEF DESCRIPTION

In one aspect, an electrical distribution apparatus is provided. The electrical distribution apparatus includes a backplane for supporting a plurality of electrical devices, a bus bar assembly coupled to the backplane, and a frame that supports the backplane. The electrical distribution apparatus also includes at least one positioning member that facilitates positioning the backplane relative to the frame. The at least one positioning member at least partially supports the backplane such that the backplane is positionable between a first position and a second position. The backplane contacts the frame in the second position.

In another aspect, a method of assembling an electrical distribution system is provided. The method includes coupling a bus bar assembly to a backplane and positioning the backplane such that the backplane is at least partially supported by a positioning member. The method also includes positioning the backplane between a first position and a second position while the backplane is supported by the positioning member. The backplane contacts the frame when the backplane is in the second position. The method further includes coupling the backplane to the frame while the backplane is in the second position.

In yet another aspect, an electrical distribution system is provided. The electrical distribution system includes an enclosure defining an interior volume, a plurality of circuit breakers, and an electrical distribution apparatus positioned at least partially within the interior volume. The electrical distribution apparatus includes a backplane supporting the plurality of circuit breakers, a bus bar assembly coupled to the backplane and to the plurality of circuit breakers, and a frame that supports the backplane within the interior volume. The electrical distribution apparatus also includes at least one positioning member that facilitates positioning the backplane relative to the frame. The at least one positioning member at least partially supports the backplane such that the backplane is positionable between a first position and a second position. The backplane contacts the frame when the backplane is in the second position.

Although specific features of various embodiments may be shown in some drawings and not in others, this is for convenience only. Any feature of any drawing may be referenced and/or claimed in combination with any feature of any other drawing.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Exemplary embodiments of distribution systems and methods of manufacturing distribution systems are described herein. The distribution systems generally include a bus bar assembly, a backplane, and a frame. The bus bar assembly and the backplane are modular components that are configured to couple to each other. In some embodiments, the bus bar assembly includes engagement features that extend into openings in the backplane. In further embodiments, the bus bar assembly includes openings that receive engagement features extending from the backplane. The frame is configured to support the backplane and the bus bar assembly when the backplane is coupled to the frame. In some embodiments, at least one of the backplane and the frame includes a positioning member that at least partially supports the backplane to allow positioning of the backplane relative to the frame. In further embodiments, the backplane includes handle portions that facilitate an operator handling the backplane.

Figure 1:
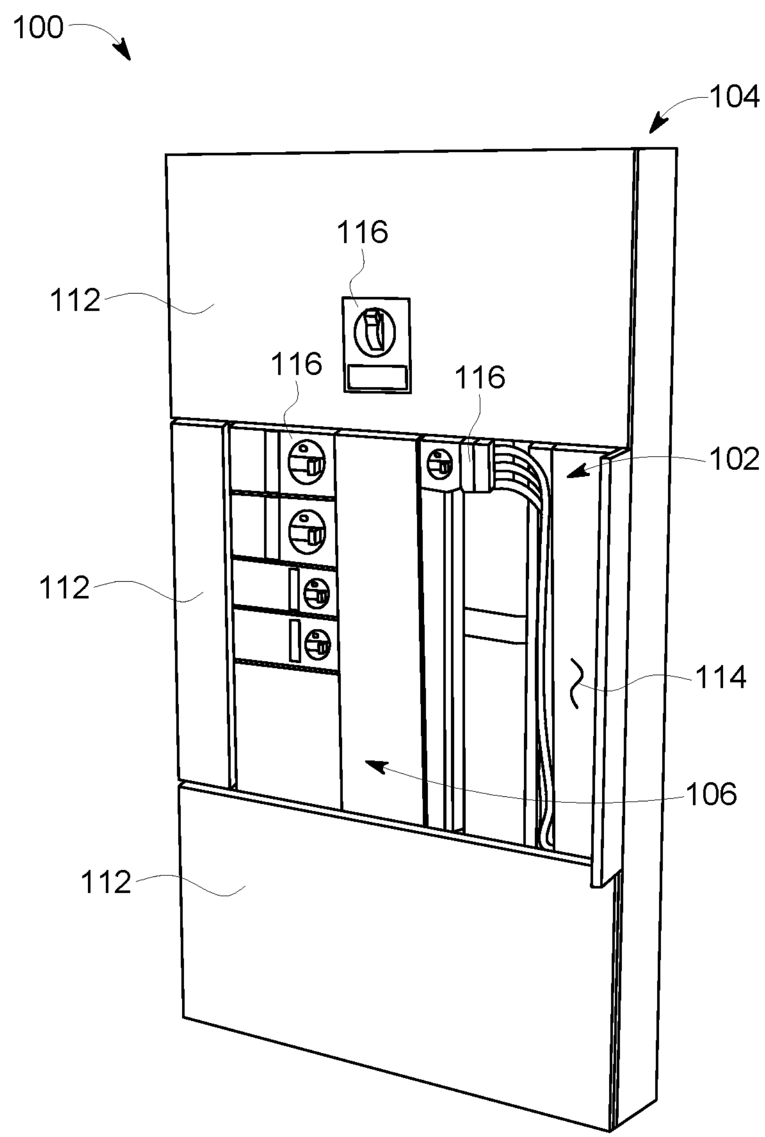
FIG. 1 is a perspective view of an electrical distribution system including an electrical distribution apparatus and an enclosure.
Figure 2:
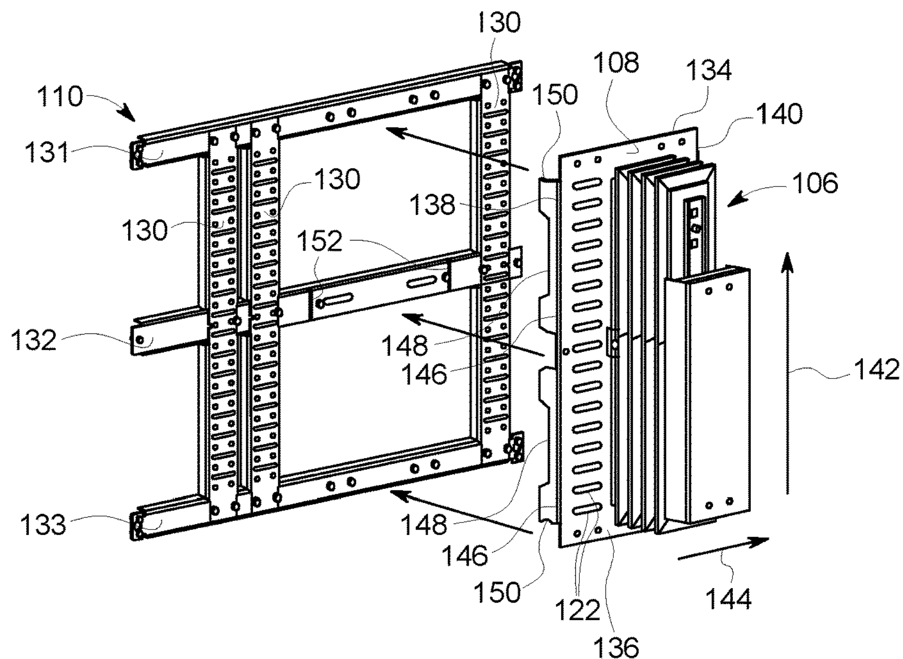
FIG. 2 is a partially exploded view of the electrical distribution apparatus shown in FIG. 1.

FIG. 1 is a perspective view of an exemplary electrical distribution system 100 including an electrical distribution apparatus 102 and an enclosure 104. FIG. 2 is a partially exploded view of electrical distribution apparatus 102. Electrical distribution apparatus 102 includes a bus bar assembly 106 and a backplane 108 mounted to a frame 110 within enclosure 104. Electrical distribution apparatus 102 is shown in the form of a panelboard. In alternative embodiments, electrical distribution system 100 includes any electrical distribution apparatus 102 that enables electrical distribution system 100 to operate as described herein.

In the exemplary embodiment, enclosure 104 includes a plurality of panels 112 isolating an interior volume 114 of enclosure 104 from an exterior environment. Enclosure 104 is configured to receive bus bar assembly 106 and backplane 108 within interior volume 114. In alternative embodiments, electrical distribution system 100 includes any enclosure 104 that enables electrical distribution system 100 to operate as described herein.

Also, in the exemplary embodiment, electrical distribution system 100 is configured to electrically couple to a main power circuit, such as a three-phase power supply, and to distribute power to one or more branch circuits that are electrically coupled to electrical distribution apparatus 102 through electrical devices. In the exemplary embodiment, electrical devices 116 are electrically coupled to bus bar assembly 106 along the perimeter of bus bar assembly 106. In particular, electrical devices 116 include a main breaker electrically coupled to bus bar assembly 106 along an end of bus bar assembly, and a plurality of branch circuit breakers electrically coupled to bus bar assembly 106 along the sides of bus bar assembly 106. In alternative embodiments, electrical distribution system 100 includes any electrical device 116 that enables electrical distribution system 100 to operate as described herein. For example, in some embodiments, electrical distribution system 100 includes, without limitation, any of the following electrical devices: circuit breakers, circuit switching devices, electrical meters, fuses, intelligent devices, relays, protection devices such as surge protection devices and transient voltage surge suppressors, power supplies such as three-phase and four-phase power supplies, and circuit interrupters other than circuit breakers, such as contactors, motor starters, motor controllers, and other load controllers.

In reference to FIGS. 1 and 2, backplane 108 defines a plurality of elongate slots 122 arranged symmetrically about a central portion of backplane 108. Each slot 122 is sized and shaped to receive a fastener to secure each electrical device 116 to backplane 108. Slots 122 are arranged in two rows on each side of bus bar assembly 106 when bus bar assembly 106 is coupled to backplane 108. The two rows include a bus side row and a load side row. Slots 122 are spaced from one another at a defined increment in a longitudinal direction 142 of backplane 108 such that slots 122 align with mounting features (e.g., fasteners or fastener openings) on electrical devices 116 when electrical devices 116 are connected to bus bar assembly 106 and bus bar assembly 106 is coupled to frame 110. Slots 122 are elongate in a transverse direction 144 orthogonal to longitudinal direction 142 to provide flexibility in the mounting position of electrical devices 116.

As shown in FIG. 2, bus bar assembly 106 includes a plurality of modular bus bars arranged in a stacked configuration. Each bus bar is configured to couple to one phase of a multi-phase power supply. In some embodiments, the bus bars are separated by spacers and/or bus bar insulators. In alternative embodiments, electrical distribution apparatus 102 includes any bus bar assembly 106 that enables electrical distribution apparatus 102 to operate as described herein.

In the exemplary embodiment, frame 110 includes a plurality of support members to which components of electrical distribution system 100 are mounted. In the exemplary embodiment, frame 110 includes vertical rails 130 and horizontal rails 131, 132, 133. Vertical rails 130 extend parallel to a longitudinal axis of frame 110, and are oriented substantially parallel to each other. Horizontal rails 131, 132, 133 are oriented substantially orthogonal to vertical rails 130 and substantially parallel to each other. An upper horizontal rail 131 is coupled to a first end of each vertical rail 130. A lower horizontal rail 133 is coupled to a second end of each vertical rail 130. An intermediate horizontal rail 132 is coupled to each vertical rail 130 between the first end and the second end. Accordingly, intermediate horizontal rail 132 is positioned between upper horizontal rail 131 and lower horizontal rail 133. In the exemplary embodiment, intermediate horizontal rail 132 is positioned approximately midway between upper horizontal rail 131 and lower horizontal rail 133. Horizontal rails 131, 132, 133 and vertical rails 130 extend across a length and width of frame 110. Moreover, the thickness of horizontal rails 131, 132, 133 and vertical rails 130 defines a depth of frame 110. In alternative embodiments, electrical distribution apparatus 102 includes any frame 110 that enables electrical distribution apparatus 102 to operate as described herein.

Also, in the exemplary embodiment, backplane 108 includes a first end 134, a second end 136, a first side 138, and a second side 140 collectively defining a perimeter of backplane 108. First side 138 and second side 140 each extend from first end 134 to second end 136. Accordingly, backplane 108 extends a length in longitudinal direction 142 from first end 134 to second end 136, and a width in the transverse direction 144. In alternative embodiments, electrical distribution apparatus 102 includes any backplane 108 that enables electrical distribution apparatus 102 to operate as described herein.

In addition, in the exemplary embodiment, backplane 108 is coupled to each horizontal rail 132 of frame 110. In particular, first end 134 is coupled to upper horizontal rail 131 and second end 136 is coupled to lower horizontal rail 133. Intermediate horizontal rail 132 is coupled to backplane 108 between first end 134 and second end 136. Backplane 108 is positioned on frame 110 such that backplane 108 is spaced from vertical rails 130 by a lateral spacing sized to receive electrical devices 116. In some embodiments, the lateral spacing is varied to accommodate electrical devices 116 having different sizes. For example, the lateral spacing is adjusted by varying the location at which backplane 108 is coupled to frame 110, or by varying the width of backplane 108 and/or bus bar assembly 106.

Also, in the exemplary embodiment, backplane 108 includes flanges 146 extending from first side 138 and second side 140. In the exemplary embodiment, backplane 108 includes four flanges 146. Flanges 146 extend along the length of backplane 108 and provide support to backplane 108. In addition, flanges 146 facilitate an operator handling and positioning backplane 108. For example, flanges 146 include a handle portion 148 for an operator to grasp. Handle portion 148 includes a recess and/or opening formed into each flange 146. In addition, a portion of flange 146 is folded over, thickened, and/or rounded to remove sharp edges. In some embodiments, handle portion 148 includes a material that facilitates an operator grasping handle portion 148, such as a gripping material and/or a loop. In alternative embodiments, backplane 108 includes any flange 146 that enables backplane 108 to operate as described herein. In some embodiments, flanges 146 are omitted. In further embodiments, backplane 108 and/or bus bar assembly 106 includes handle portions 148 separate from flanges 146.

Moreover, in the exemplary embodiment, flanges 146 define notches 150 and act as positioning members for backplane 108. Notches 150 are configured to receive a portion of frame 110. Notches 150 include a curved edge that is positioned against frame 110 to enable backplane 108 to pivot relative to frame 110. Backplane 108 pivots between a first position and a second position. In the first position, backplane 108 is at least partially angled relative to frame 110. In the second position, first edge 134 and second edge 136 of backplane 108 contact frame 110. During assembly, an operator positions flanges 146 against bottom horizontal rail 132 such that flanges 146 and frame 110 at least partially support backplane 108. Flanges 146 are maintained against bottom horizontal rail 132 and backplane 108 is pivoted into the second position. In some embodiments, backplane 108 contacts each of horizontal rails 131, 132, 133 in the second position. After backplane 108 is pivoted into position, backplane 108 is coupled to frame 110. In one embodiment, fasteners extend through openings in backplane 108 and frame 110 to secure backplane 108 in position. In alternative embodiments, backplane 108 is positioned on frame 110 in any manner that enables electrical distribution apparatus 102 to operate as described herein. For example, in some embodiments, backplane 108 is received by notches 150 defined by frame 110 to facilitate positioning backplane 108 relative to frame 110.

In the exemplary embodiment, frame 110 defines alignment features 152 that facilitate aligning backplane 108 relative to frame 106. Alignment features 152 include grooves that are configured to receive an edge of backplane 108 and align backplane 108 relative to frame 110. Alignment features 152 are defined by intermediate horizontal rail 132 and are spaced from vertical rails 130. Backplane 108 is positioned approximately midway between vertical rails 130 when backplane 108 is aligned with alignment features 152. In alternative embodiments, frame 110 includes any alignment features 152 that enable electrical distribution system 100 to operate as described herein. For example, in some embodiments, at least one of upper horizontal rail 131 and lower horizontal rail 133 defines alignment feature 152. In further embodiments, alignment features 152 include protuberances that abut against an edge of backplane 108.

Figure 3:
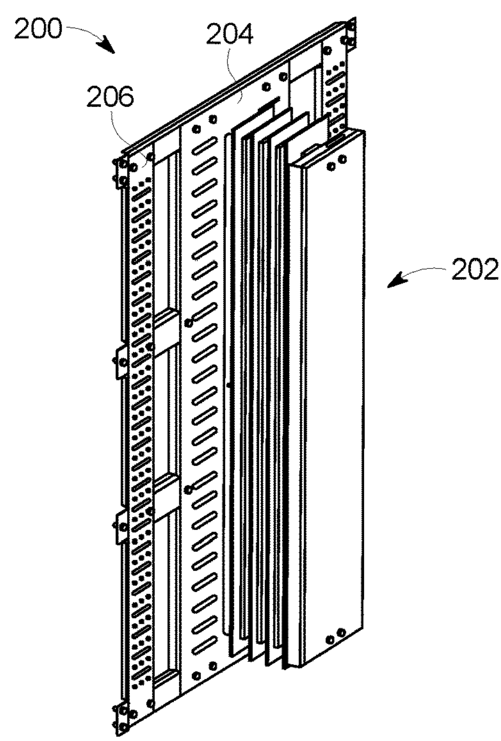
FIG. 3 is a perspective view of an electrical distribution apparatus including a bus bar assembly and a backplane coupled to a frame.
Figure 4:
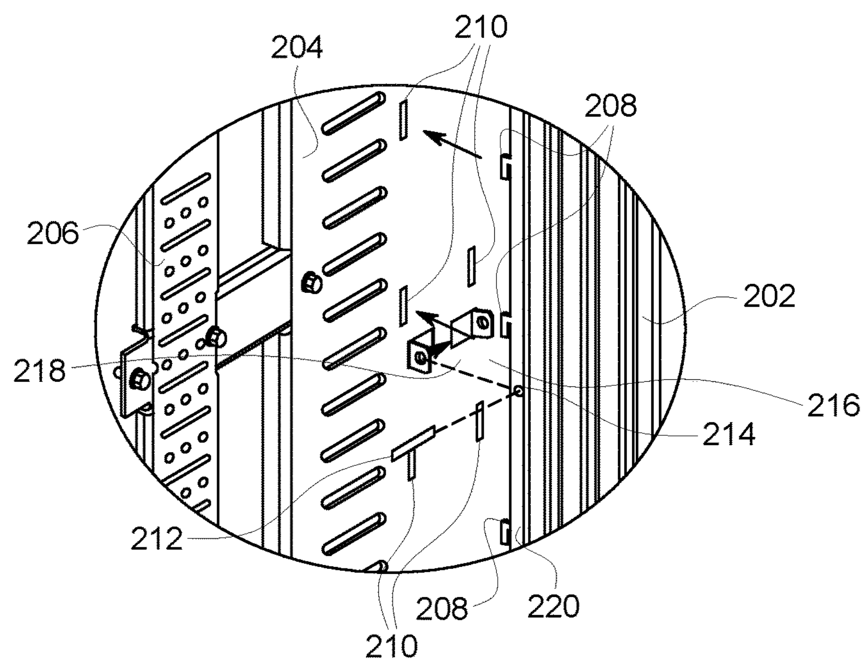
FIG. 4 is an enlarged view of a portion of the electrical distribution apparatus shown in FIG. 3.

FIG. 3 is a perspective view of an electrical distribution apparatus 200 including a bus bar assembly 202 and a backplane 204 coupled to a frame 206. FIG. 4 is an enlarged view of a portion of electrical distribution apparatus 200. Frame 206 is configured to support bus bar assembly 202 and backplane 204 within enclosure 104 (shown in FIG. 1). Bus bar assembly 202 and backplane 204 are modular units that are configured to couple to each other. In particular, bus bar assembly 202 includes engagement features 208 that are configured to extend through openings 210 in backplane 108 and couple bus bar assembly 202 to backplane 204. Moreover, engagement features 208 at least partially support bus bar assembly 202.

In the exemplary embodiment, engagement features 208 extend from bus bar assembly 202 and have a hook shape. In particular, engagement features 208 extend outward from a surface of support 220 and towards backplane 108. Moreover, engagement features 208 are integrally formed with support 220. In the exemplary embodiment, a catch portion of engagement features 208 extends at an angle relative to a base portion to define the hook shape. In the exemplary embodiment, engagement features 208 define an approximately 90° angle. The base portion extends substantially perpendicular to the surface of support 220 and the catch portion extends substantially parallel to the surface. Accordingly, engagement features 208 are configured to catch or engage objects. In alternative embodiments, electrical distribution apparatus 200 includes any engagement feature 208 that enables electrical distribution apparatus 200 to operate as described herein. For example, in some embodiments, at least one engagement feature 208 extends from a surface of backplane 204. In further embodiments, engagement features 208 are positionable. In some embodiments, engagement features 208 include, without limitation, any of the following: a mushroom shaped portion, an arrow shaped portion, a barb, a knob, a protuberance, a wedge, a teardrop shaped portion, and any other engagement component.

Also, in the exemplary embodiment, a central portion of backplane 204 includes openings 210 configured to receive engagement features 208. Openings 210 are elongate slots and extend in a vertical direction. In alternative embodiments, electrical distribution apparatus 200 includes any opening 210 that enables electrical distribution apparatus 200 to operate as described herein. For example, in some embodiments, electrical distribution apparatus 200 includes at least one opening 210 defined by bus bar assembly 202.

Also, in the exemplary embodiment, backplane 204 and bus bar assembly 202 include openings 214, 216 sized and shaped to receive locking pins 212. Locking pins 212 secure bus bar assembly 202 to backplane 204 to inhibit movement of bus bar assembly 202 relative to backplane 204. In particular, locking pins 212 inhibit movement of bus bar assembly 202 in a longitudinal direction, and inhibit engagement features 208 disengaging from backplane 204. Coupling tabs 218 extend from the front surface of backplane 204 and define openings 216. Supports 220 extend from the sides of bus bar assembly 202 and define corresponding openings 214. In alternative embodiments, electrical distribution apparatus 100 includes any locking feature that enables electrical distribution apparatus 100 to operate as described herein.

In addition, in the exemplary embodiment, during assembly of electrical distribution apparatus 200, engagement features 208 are inserted into openings 210 such that the hook portions of engagement features 208 extend beyond backplane 204. Bus bar assembly 202 is then positioned such that engagement features 208 engage backplane 204. When engaged with backplane 204, engagement features 208 inhibit removal of bus bar assembly 202 from backplane 204. In the exemplary embodiment, locking pins 212 are removably inserted through openings 214 and openings 216.

In alternative embodiments, bus bar assembly 202 is coupled to backplane 204 in any manner that enables electrical distribution system 100 to operate as described herein.

Figure 5:
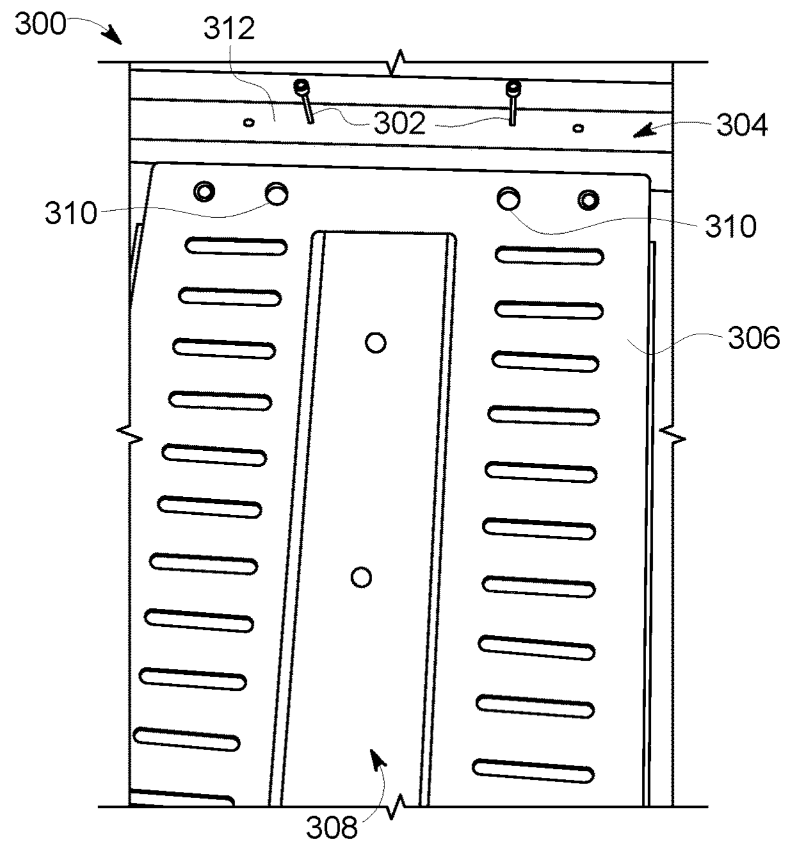
FIG. 5 is an enlarged view of a portion of an electrical distribution apparatus including positioning members.

FIG. 5 is an enlarged view of a portion of an electrical distribution apparatus 300 including positioning members 302. Electrical distribution apparatus 300 includes positioning members 302, a frame 304, a backplane 306, and a bus bar assembly 308. Bus bar assembly 308 is coupled to backplane 306. Backplane 306 includes openings 310 configured to receive positioning members 302. Positioning members 302 extend from a top rail 312 of frame 304 and are configured to support at least a portion of bus bar assembly 308 and backplane 306. Accordingly, positioning members 302 facilitate positioning backplane 306 between a first position and a second position. In the first position, backplane 306 is suspended by positioning members 302 such that backplane 306 is spaced from frame 304. In the second position, backplane 306 contacts frame 304. In the exemplary embodiment, positioning members 302 each include an elongate fastener, such as a shoulder bolt, that is coupled to top rail 312. In alternative embodiments, electrical distribution apparatus 300 includes any positioning member 302 that enables electrical distribution apparatus 300 to operate as described herein. For example, in some embodiments, positioning members 302 extend from backplane 306.

During assembly of electrical distribution apparatus 300, an operator positions backplane 306 such that positioning members 302 extend through openings 310. The operator then slides backplane 306 along positioning members 302 until backplane 306 contacts frame 304. Openings 310 are sized to receive positioning members 302 and facilitate backplane 306 sliding along positioning members 302. In particular, openings 310 are larger than the heads of positioning members 302. Accordingly, openings 310 are oversized in comparison to openings configured to receive fasteners that secure backplane 306 to frame 304. Positioning members 302 and openings 310 are positioned such that backplane 306 and frame 304 are aligned. In particular, the centers of openings 310 are positioned lower than the centers of other openings in backplane 306 because positioning members 302 contact an edge of openings 310 and are not aligned with the center of openings 310. After backplane 306 is aligned and positioned relative to frame 304, the operator secures backplane 306 to frame 304. Accordingly, positioning members 302 facilitate the operator positioning backplane 306 relative to frame 304 and facilitate the operator coupling backplane 306 and frame 304.

Figure 6:
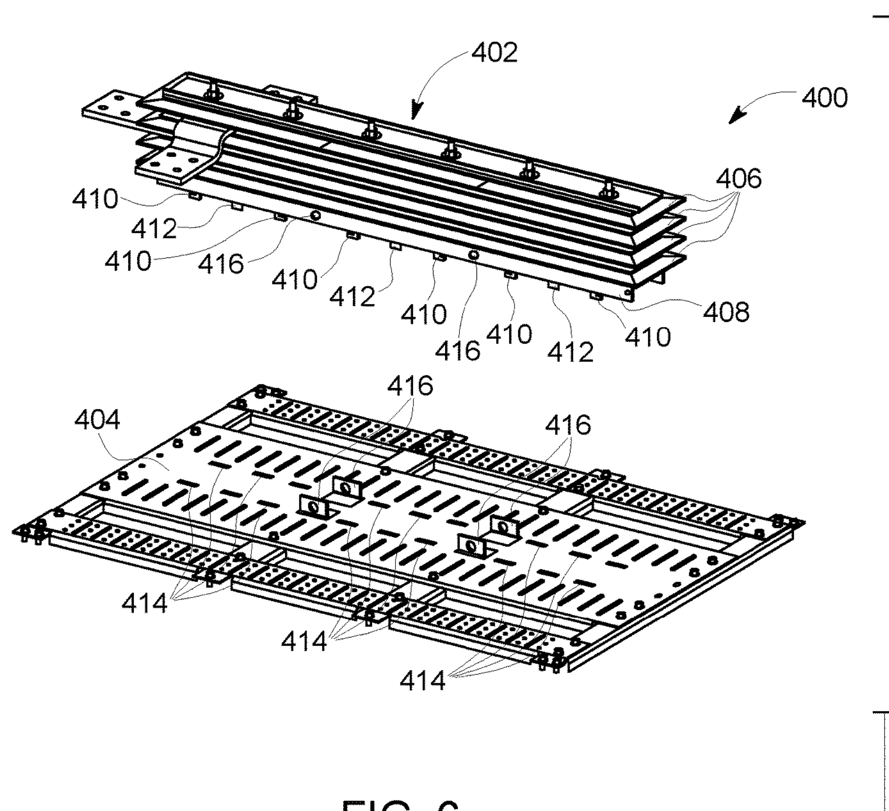
FIG. 6 is a perspective view of an electrical distribution apparatus including a bus bar assembly and a backplane.
Figure 7:
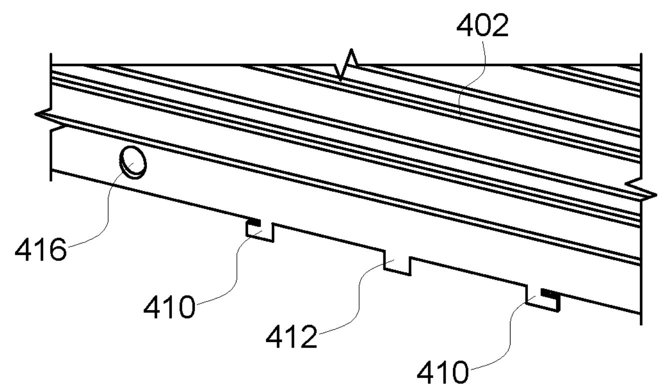
FIG. 7 is an enlarged view of a portion of the bus bar assembly shown in FIG. 6.

FIG. 6 is a perspective view of an embodiment of an electrical distribution apparatus 400 including a bus bar assembly 402 and a backplane 404. FIG. 7 is an enlarged view of a portion of bus bar assembly 402. Bus bar assembly 402 includes bus bars 406, bus bar support 408, and engagement features 410, 412. Engagement features 410, 412 extend from bus bar support 408 and are configured to extend into openings 414 of backplane 404. Openings 414 are elongate slots and extend in a vertical direction. Openings 414 are aligned vertically in two rows in a central portion of backplane 404. Engagement features 410, 412 include hooks 410 and stops 412 that are sized to fit within openings 414 and inhibit movement of bus bar assembly 402. In particular, hooks 410 are configured to engage backplane 404 and couple bus bar assembly 402 to backplane 404. Stops 412 are configured to abut against at least one edge of openings 414 and at least partially support bus bar assembly 402. In addition, bus bar assembly 402 and backplane 404 each include locking openings 416 configured to receive locking pins 212 (shown in FIG. 4) that secure bus bar assembly 402 to backplane 404. In alternative embodiments, electrical distribution apparatus 400 includes any component that enables electrical distribution apparatus 400 to operate as described herein.

In the exemplary embodiment, hooks 410 are oriented in different directions. In particular, a first set of hooks 410 face downward and a second set of hooks 410 face upward. Upward-facing hooks 410 engage backplane 404 when bus bar assembly 402 is moved upward. Downward-facing hooks 410 engage backplane 404 when bus bar assembly 402 is moved downward. Accordingly, hooks 410 inhibit movement of bus bar assembly 402 in different directions. Each stop 412 is positioned between a forward-facing hook 410 and an upward-facing hook 410. In alternative embodiments, engagement features 410, 412 are positioned in any manner that enables electrical distribution apparatus 400 to operate as described herein.

Figure 8:
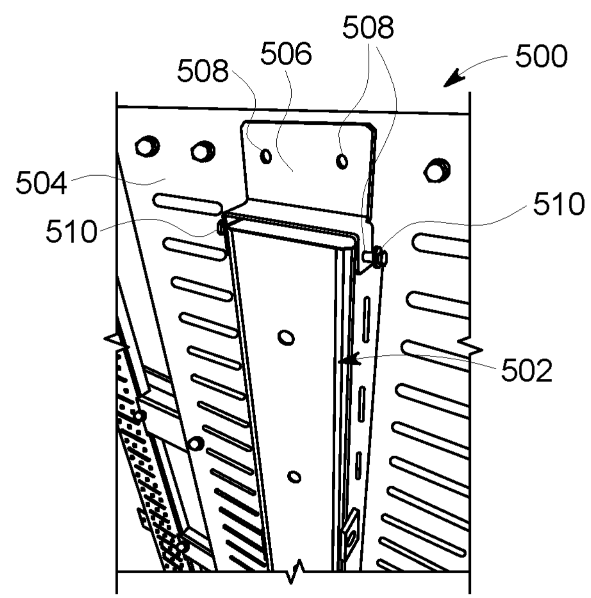
FIG. 8 is an enlarged perspective view of an embodiment of an electrical distribution apparatus including a bus bar assembly coupled to a backplane by a bracket.

FIG. 8 is an enlarged perspective view of an electrical distribution apparatus 500 including a bus bar assembly 502 coupled to a backplane 504 by a bracket 506. Bracket 506 includes orthogonal portions that contact bus bar assembly 502 and backplane 504. In addition, bracket 506 defines openings 508 configured to receive fasteners 510. Fasteners 510 couple bracket 506 to bus bar assembly 502 and backplane 504. Accordingly, bracket 506 inhibits longitudinal and transverse movement of bus bar assembly 502 relative to backplane 504. In alternative embodiments, bus bar assembly 502 and backplane 504 are coupled together in any manner that enables electrical distribution apparatus 500 to operate as described herein.

Figure 9:
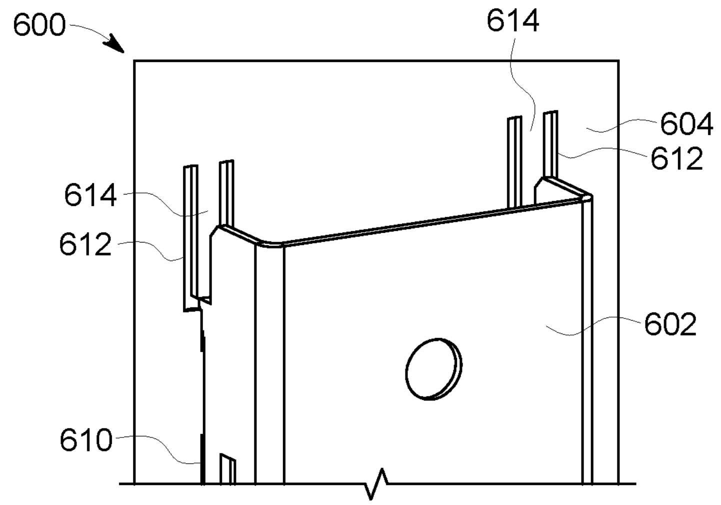
FIG. 9 is an enlarged perspective view of an electrical distribution apparatus including a bus bar assembly coupled to a backplane.
Figure 10:
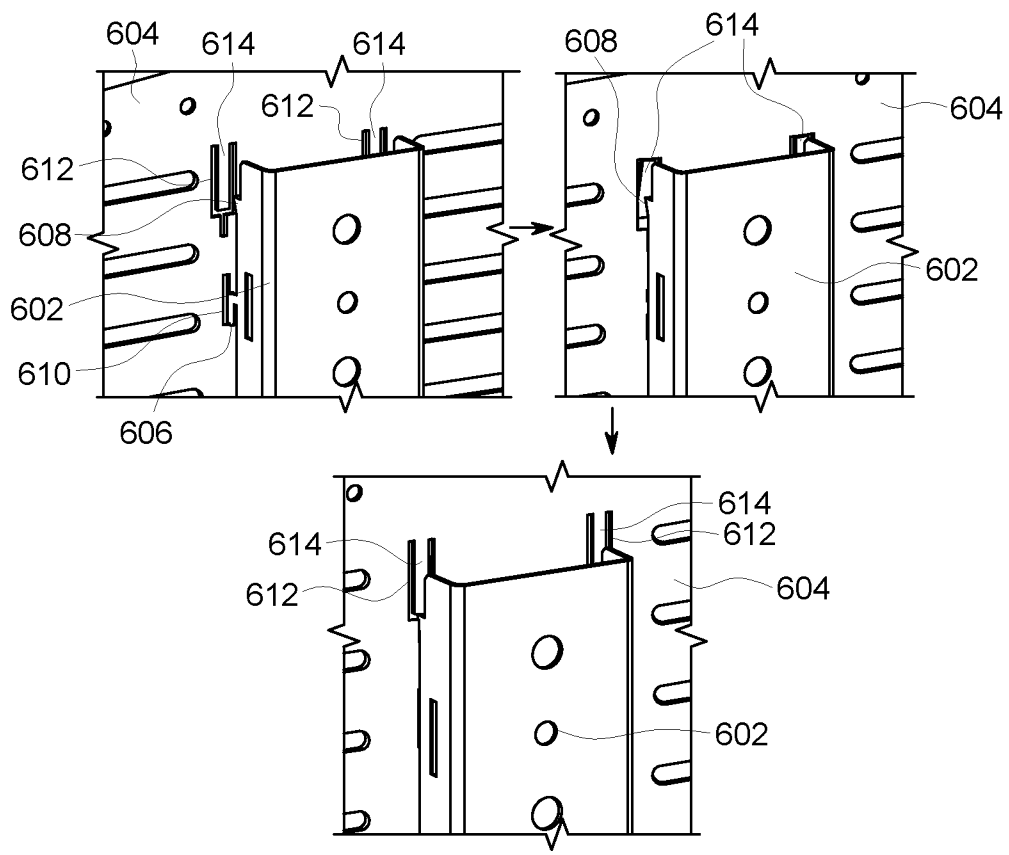
FIG. 10 is a series of front perspective views of engagement features of the electrical distribution apparatus shown in FIG. 9.
Figure 11:
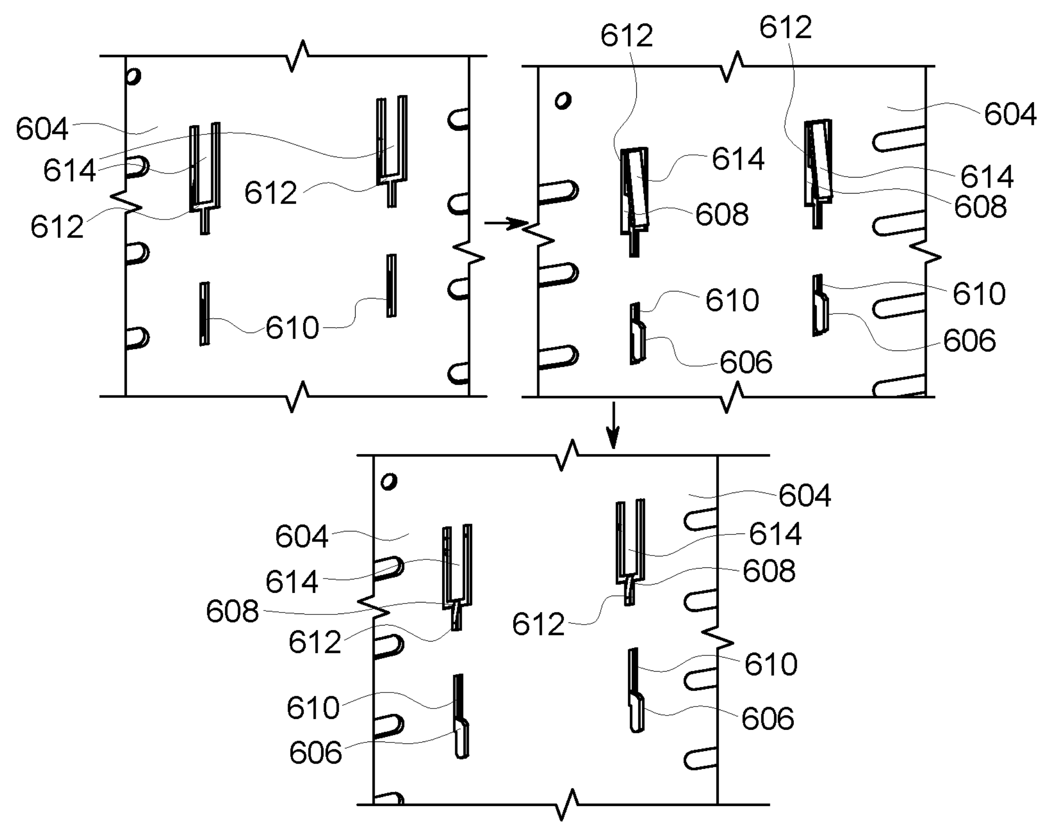
FIG. 11 is a series of rear perspective views of engagement features of the electrical distribution apparatus shown in FIG. 9.

FIG. 9 is an enlarged perspective view of an electrical distribution apparatus 600 including a bus bar assembly 602 coupled to a backplane 604. FIG. 10 is a series of front perspective views of engagement features 606, 608 of electrical distribution apparatus 600. FIG. 11 is a series of rear perspective views of engagement features 606, 608 of electrical distribution apparatus 600. Engagement features 606, 608 extend from bus bar assembly 602 and are configured to extend through openings 610, 612 defined by backplane 604. Engagement features 606, 608 include hooks 606 and stops 608. Openings 610, 612 include slots 610 and stepped openings 612. In alternative embodiments, electrical distribution apparatus 600 includes any engagement feature 606, 608 and/or opening 610, 612 that enables electrical distribution apparatus 600 to operate as described herein.

In the exemplary embodiment, bus bar assembly 602 and backplane 604 are configured such that engagement features 606, 608 extend into respective openings 610, 612. In particular, hooks 606 extend into slots 610 and stops 608 extend into stepped openings 612. A displaceable member 614 extends through at least a portion of each stepped opening 612. Displaceable member 614 is positionable between a neutral position and a displaced position. Displaceable member 614 is biased towards the neutral position. When in the neutral position, displaceable member 614 is aligned with backplane 604. When in the displaced position, displaceable member 614 is angled relative to backplane 604. Engagement features 606, 608 are configured to move displaceable members 614 between the neutral position and the displaced position when engagement features 606, 608 are inserted into openings 610, 612. In the exemplary embodiment, stops 608 cause displaceable members 614 to move to the displaced position when stops 608 are inserted into stepped openings 612. Displaceable members 614 return to the neutral position when stops 608 are positioned within a bottom portion of stepped openings 612 or removed from stepped openings 612. When stops 608 extend into stepped openings 612 and displaceable members 614 are in the neutral position, displaceable members 614 inhibit movement of bus bar assembly 602. In particular, displaceable members 614 abut against stops 608 and inhibit engagement features 606, 608 disengaging from backplane 604. Accordingly, engagement features 606, 608, openings 610, 612, and displaceable members 614 couple bus bar assembly 602 to backplane 604. In alternative embodiments, bus bar assembly 602 is coupled to backplane 604 in any manner that enables electrical distribution apparatus 500 to operate as described herein.

In reference to FIGS. 1, 3, 4, and 10 a method of assembling an electrical distribution system includes positioning bus bar assembly 106 relative to backplane 108 such that engagement features 208 extend into openings 210. The method also includes positioning bus bar assembly 106 such that engagement features 208 engage a surface. In some embodiments, locking pins 212 are inserted into openings 214, 216 in bus bar assembly 106 and backplane 108 to inhibit movement of bus bar assembly 106 relative to backplane 108. The method further includes positioning backplane 108 such that positioning members 302 support at least a portion of backplane 108 and moving backplane 108 between a first position and a second position while backplane 108 is supported by positioning members 302. In some embodiments, backplane 108 is pivoted relative to frame 110. In further embodiments, backplane 108 slides along positioning members 302. The method also includes coupling backplane 108 to frame 110.

The distribution systems described above generally include a bus bar assembly, a backplane, and a frame. The bus bar assembly and the backplane are modular components that are coupled together at an installation site. In some embodiments, the bus bar assembly includes engagement features that extend into openings in the backplane and couple the bus bar assembly to the backplane. In further embodiments, the backplane includes engagement features that extend into openings in the bus bar assembly. The backplane is coupled to and supported by the frame. In some embodiments, at least one of the backplane and the frame includes a positioning member that at least partially supports the backplane and facilitates coupling the backplane to the frame.

An exemplary technical effect of the methods, systems, and apparatus described herein includes at least one of: (a) reducing cost and time required to assemble electrical distribution systems; (b) providing modular components for an electrical distribution apparatus; (c) providing electrical distribution apparatuses that have a scalable design; (d) providing electrical distribution apparatuses that are ergonomic for operators to handle; (e) reducing the cost and time required to install electrical distribution apparatus; (f) increase shipping and manufacturing options for electrical distribution apparatuses; (g) provide electrical distribution apparatuses that have improved paths to market; (h) provide electrical distribution apparatuses that are easier for distributors to stock; and (i) provide electrical distribution apparatuses that are manufactured at an increased number of distributed manufacturing sites.

Exemplary embodiments of electrical distribution apparatuses and methods of assembling electrical distribution apparatuses are described above in detail. The electrical distribution apparatuses and methods are not limited to the specific embodiments described herein but, rather, components of the electrical distribution apparatuses and/or operations of the methods may be utilized independently and separately from other components and/or operations described herein. Further, the described components and/or operations may also be defined in, or used in combination with, other systems, methods, and/or devices, and are not limited to practice with only the electrical distribution systems and apparatuses described herein.

The order of execution or performance of the operations in the embodiments of the disclosure illustrated and described herein is not essential, unless otherwise specified. That is, the operations may be performed in any order, unless otherwise specified, and embodiments of the disclosure may include additional or fewer operations than those disclosed herein. For example, it is contemplated that executing or performing a particular operation before, contemporaneously with, or after another operation is within the scope of aspects of the disclosure.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electrical distribution apparatus comprising:

a backplane for supporting a plurality of electrical devices;

a bus bar assembly coupled to said backplane;

a frame that supports said backplane; and at least one positioning member that facilitates positioning said backplane relative to said frame, said at least one positioning member at least partially supporting said backplane such that said backplane is positionable between a first position and a second position, wherein said backplane contacts said frame in the second position;

wherein said backplane comprises a first side edge and a second side edge, said at least one positioning member comprising a first flange and a second flange, said first flange extending from said first side edge and said second flange extending from said second side edge.

2. The electrical distribution apparatus in accordance with claim 1, wherein said at least one positioning member comprises at least one elongate fastener.

3. The electrical distribution apparatus in accordance with claim 2, wherein said at least one positioning member extends from said frame, said backplane defining at least one opening that receives said at least one positioning member.

4. The electrical distribution apparatus in accordance with claim 3, wherein said frame comprises a plurality of vertical rails and at least one horizontal rail, said at least one horizontal rail coupled to an end of each vertical rail of said plurality of vertical rails, said at least one positioning member extending from said at least one horizontal rail.

5. The electrical distribution apparatus in accordance with claim 1, wherein each of said first flange and said second flange defines a notch that receives a portion of said frame to facilitate positioning said backplane relative to said frame.

6. The electrical distribution apparatus in accordance with claim 1, wherein said backplane comprises a handle.

7. The electrical distribution apparatus in accordance with claim 1, wherein said frame includes at least one rail, said at least one rail defining a groove that facilitates aligning said backplane relative to said frame.

8. An electrical distribution system comprising:
an enclosure defining an interior volume;
a plurality of circuit breakers; and
an electrical distribution apparatus positioned at least partially within said interior volume, said electrical distribution apparatus comprising:
a backplane supporting said plurality of circuit breakers;
a bus bar assembly coupled to said backplane and to said plurality of circuit breakers;
a frame that supports said backplane within said interior volume; and
at least one positioning member that facilitates positioning said backplane relative to said frame, said at least one positioning member at least partially supporting said backplane such that said backplane is positionable between a first position and a second position, wherein said backplane contacts said frame when said backplane is in the second position;
wherein said backplane comprises a first side edge, a second side edge, a first flange, and a second flange, said first flange extending from said first side edge, said second flange extending from said second side edge, wherein each of said first flange and said second flange defines a notch that facilitates positioning said backplane relative to said frame.

9. The electrical distribution system in accordance with claim 8, wherein said at least one positioning member comprises at least one elongate fastener extending from said frame, said backplane defining at least one opening that receives said at least one positioning member.

10. The electrical distribution system in accordance with claim 8, wherein said first flange comprises a first handle and said second flange comprises a second handle.

11. The electrical distribution system in accordance with claim 8, wherein said frame comprises a first rail, said first rail defining a groove that facilitates aligning said backplane relative to said frame.

12. The electrical distribution system in accordance with claim 11, wherein said frame comprises a second rail parallel to said first rail, said at least one positioning member including a plurality of elongate fasteners extending from said second rail.

* * * * *